United States Patent [19]
Park

[11] Patent Number: 5,694,359
[45] Date of Patent: Dec. 2, 1997

[54] FLASH MEMORY DEVICE

[75] Inventor: Joo Weon Park, Seoul, Rep. of Korea

[73] Assignee: Hyundai Electronics Industries Co., Ltd., Kyungki-do, Rep. of Korea

[21] Appl. No.: 774,263
[22] Filed: Dec. 27, 1996

[30] Foreign Application Priority Data

Dec. 29, 1995 [KR]  Rep. of Korea ............... 95-65657

[51] Int. Cl.$^6$ ............................................. G11C 29/00
[52] U.S. Cl. .......................... 365/185.09; 365/185.11; 365/200
[58] Field of Search ................. 365/185.09, 185.2, 365/200, 210

[56] References Cited

U.S. PATENT DOCUMENTS

| | | | |
|---|---|---|---|
| 5,023,839 | 6/1991 | Suzuki et al. | 365/185.2 |
| 5,128,944 | 7/1992 | Flaherty et al. | 365/200 |
| 5,134,585 | 7/1992 | Murakami et al. | 365/200 |
| 5,311,462 | 5/1994 | Wells | 365/49 |
| 5,426,607 | 6/1995 | Ishibashi | 365/200 |
| 5,502,676 | 3/1996 | Pelley, III et al. | 365/200 |

*Primary Examiner*—Son T. Dinh
*Attorney, Agent, or Firm*—Fish & Richardson P.C.

[57] ABSTRACT

The present invention relates to a flash memory cell device having a repair circuit for replacing a fail cell of main memory cell arrays with a spare cell. The flash memory device according to the present invention comprises a main memory cell array, a redundancy cell block, a redundancy row decoder, a row decoder, a column decoder, a flag bit cell block, a flag cell transfer gate, a main sense amplifier and a flag sense amplifier.

6 Claims, 5 Drawing Sheets

1

FLASH MEMORY DEVICE

FIELD OF THE INVENTION

The present invention relates to a flash memory device, and more particularly to a flash memory device which allows a defect cell occurred in a main memory cell to be repaired.

BACKGROUND OF THE INVENTION

Generally, it is said that what we call a redundancy cell is a spare cell which is added to replace a fail cell so as to improve the throughput of the device when the fail cell occurs in a main memory cell.

FIG. 1 is a block diagram for explaining a conventional flash memory device, in which a plurality of CAMs (content addressable memories; CAM1 to CAMn) are consisted in a form of latch on a address' base. Address matching circuits AM1 to AMn determine which address is a fail address in response to the output data S1 to Sn from the CAMs (CAM1 to CAMn). The output data 01 to 0n from the address matching circuits AM1 to AMn generate an enable signal EN for driving a redundancy cell array (not shown) through a NAND gate NAND1. That is, it generates an enable signal EN for driving a redundancy cell array by sensing the cell on which a decision is given as fail.

The conventional repair circuit requires a additional logic circuit because a row decoder has to enable a redundancy cell block immediately. In other words, the conventional repair circuit has a problem of a complicated structure and therefore a large chip area because it uses a CAM circuit consisted in a form of latch on a address' basis, an address matching circuit to which the output data from the CAM circuit is input, and a NAND gate to which the output data from the address matching circuit is input.

SUMMARY OF THE INVENTION

Accordingly, it is an object of the present invention to provide a flash memory device which can overcome the above mentioned problem.

To achieve the above object, an flash memory device comprising:

a main cell array having a plurality of word lines and a plurality of bit lines;

a column decoder for selecting any one of the bit lines;

a row decoder for selecting any one of the word lines;

a redundancy cell block connected between the plurality of bit lines and a plurality of spare word lines;

a flag bit cell block coupled to the plurality of word lines, for storing whether the word line is failed or not;

a flag sense amplifier coupled to a dummy bit line connected to a reference cell and the flag bit cell block;

a redundancy row decoder for selecting the spare word lines in response to the output signal of the flag sense amplifier; and a main sense amplifier coupled to the dummy bit line and the column decoder.

BRIEF DESCRIPTION OF THE DRAWINGS

For fuller understanding of the nature and object of the invention, reference should be had to the following detailed description taken in conjunction with the accompanying drawings in which.

2

Figure 1:
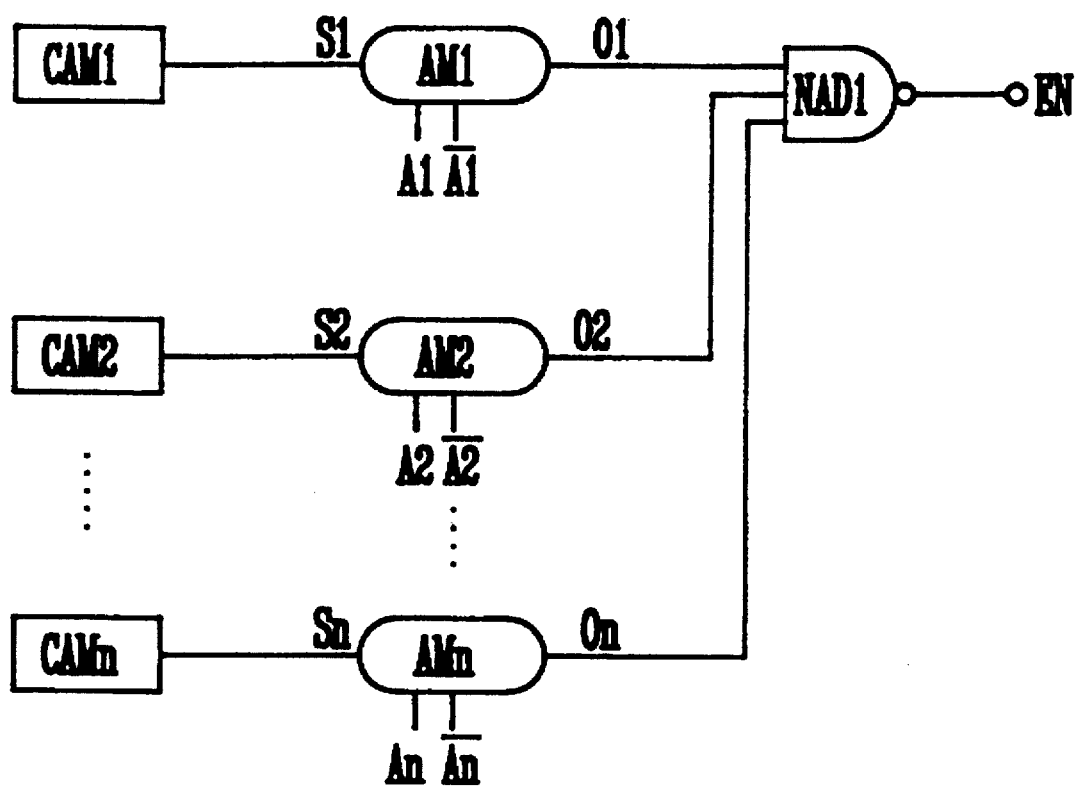
FIG. 1 is a block diagram of a conventional repair device.
Figure 2:
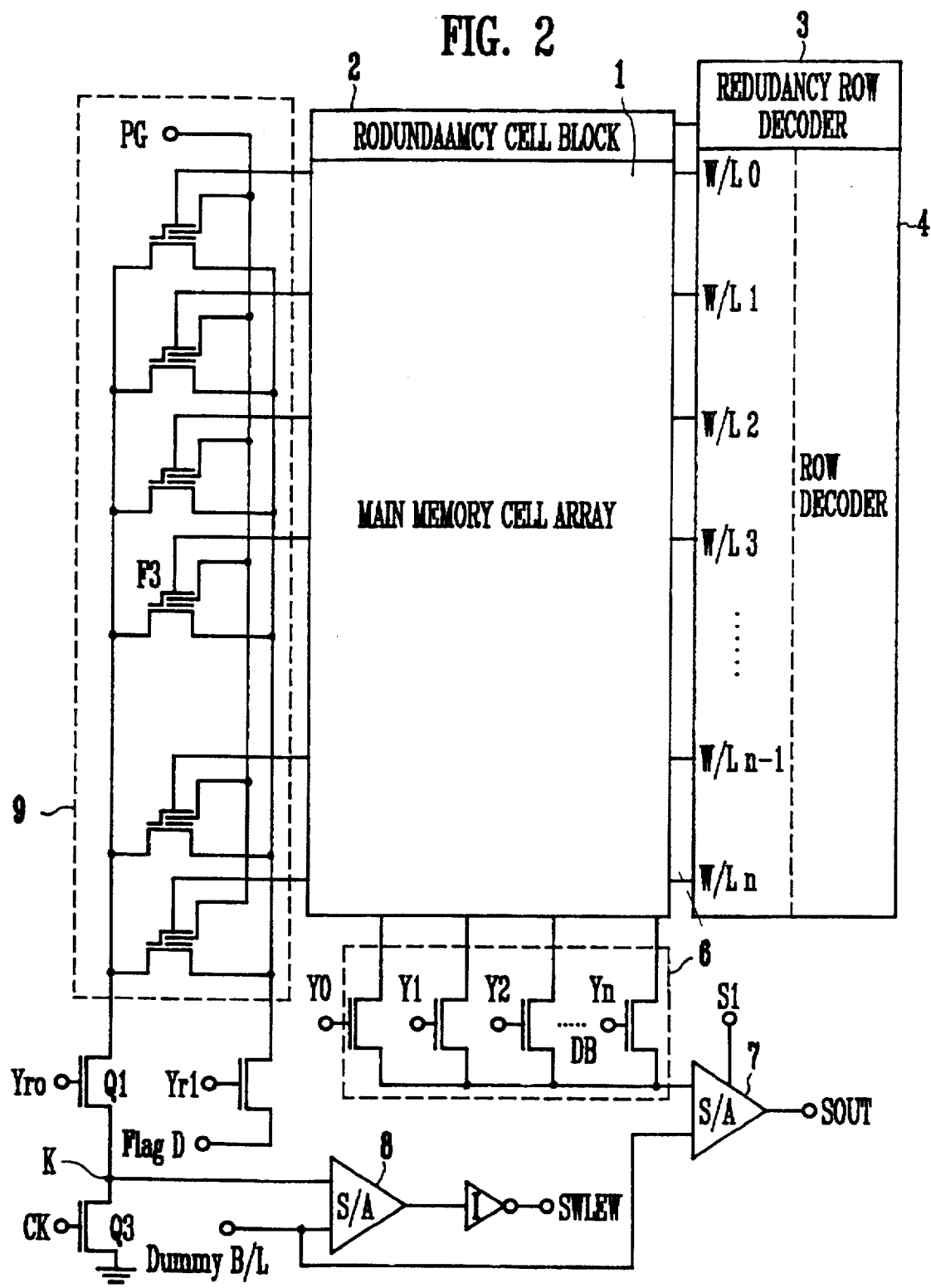
Figure 3:
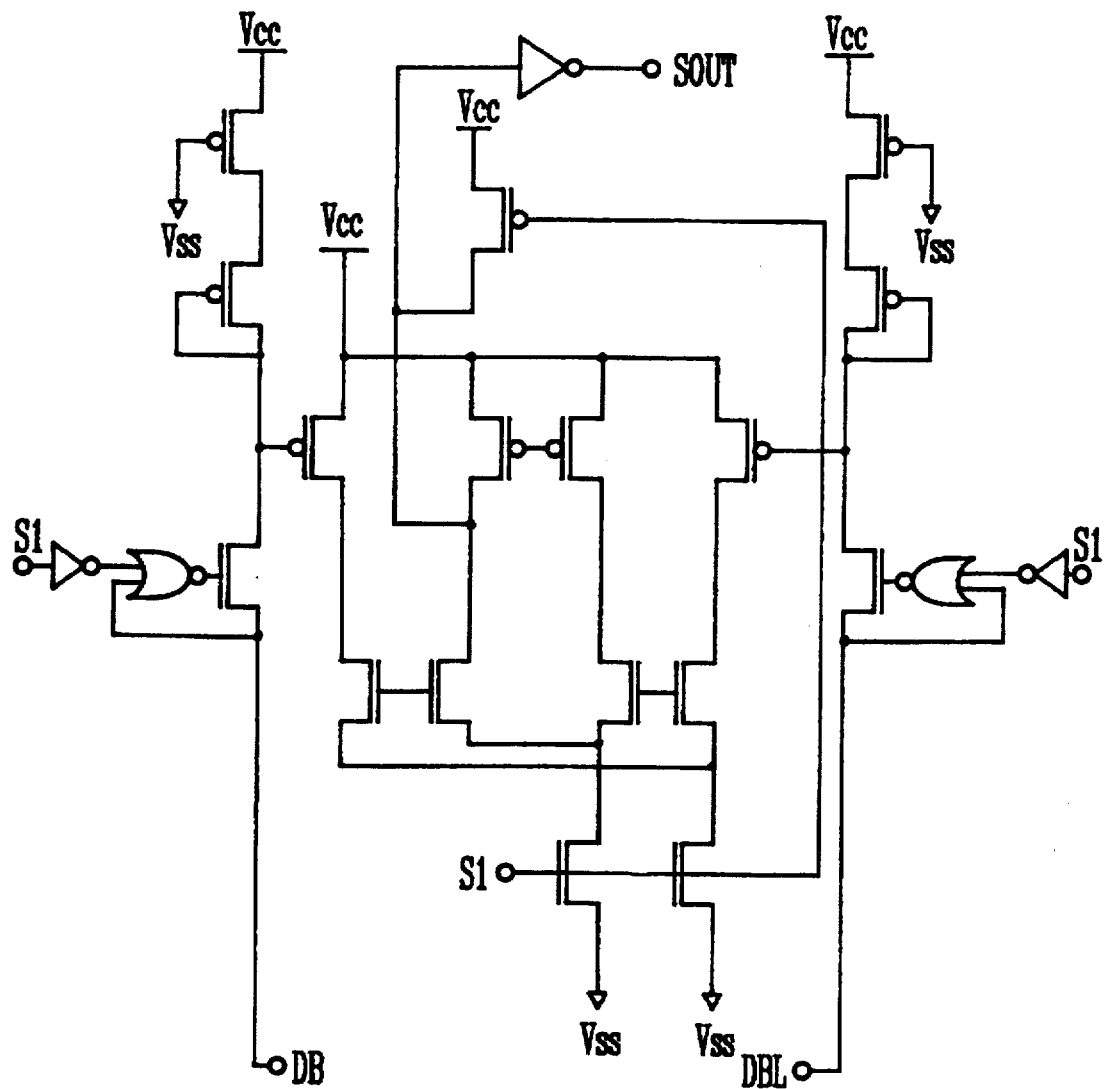
Figure 4:
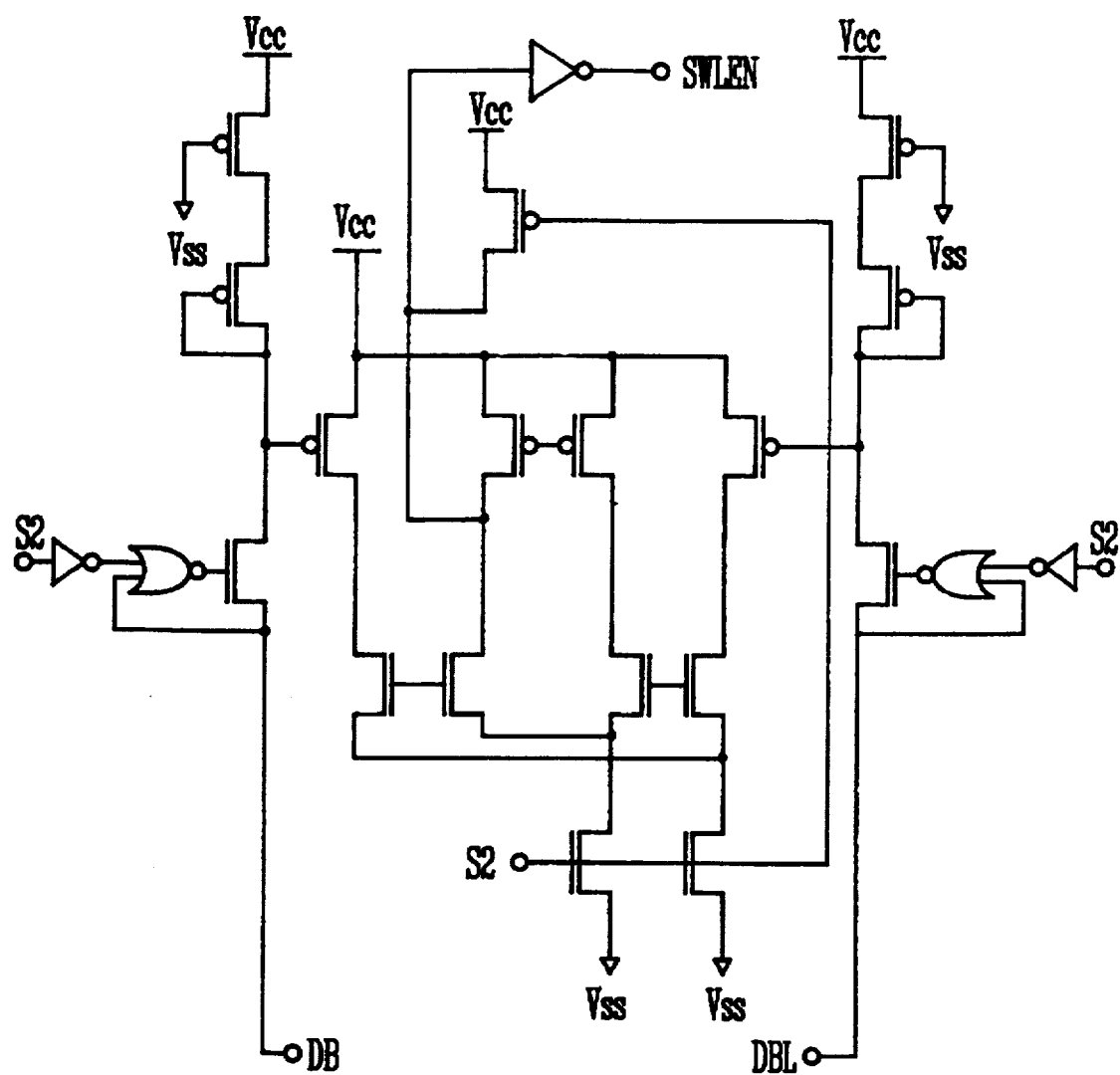

FIG. 2 illustrates a circuit diagram of a flash memory device having a repair circuit according to a first embodiment of the present invention;

FIG. 3 is a detailed view of a main sense amplifier shown in FIG. 1;

FIG. 4 is a detailed view of a flag sense amplifier shown in FIG. 1; and

Figure 5:
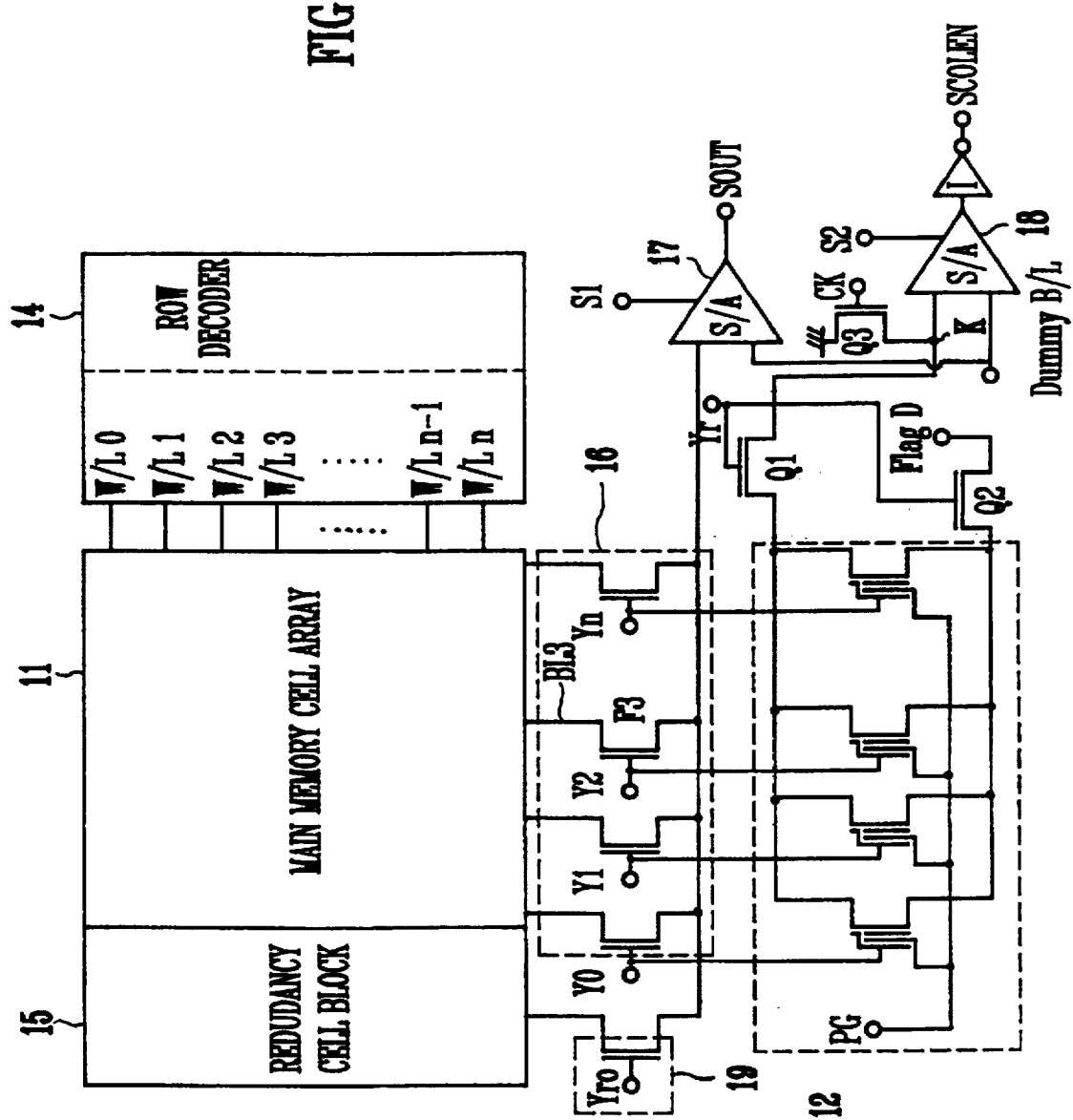

FIG. 5 illustrates a block diagram of a flash memory device according to a second embodiment of the present invention.

Similar reference characters refer to similar parts in the several views of the drawings.

DESCRIPTION OF THE INVENTION

Below, the present invention will be described in detail by reference to the accompanying drawings.

FIG. 2 illustrates a circuit diagram of a flash memory device with a repair circuit according to a first embodiment of the present invention.

A flag bit cell block 9 is positioned within a guard ring of a main memory cell array 1. The flag bit cell block 9 is consisted of a plurality of flash memory cells. Each control gate electrode of the flash memory cells is connected to a program terminal PG. A select gate electrode of each of the flash memory cells is connected to each of word lines W/Lo, W/L1, ..., W/Ln-1, W/Ln. A source electrode of each of the flash memory cells is grounded via a flag bit transfer transistor Q1, a node K and transistor Q3. The flag bit transfer transistor Q1 is turned on in response to a flag bit decoder signal Yro. The transistor Q3 is turned on in response to a clock signal CK. The drain electrode of each of the flash memory cells is connected to a flag terminal (Flag-D) through a flag bit transfer transistor Q2.

The node K is connected to one of the input terminals of the flag sense amplifier 8. Another input terminal of the flag sense amplifier 8 is connected to a dummy bit line (Dummy B/L) to which a reference cell is connected. The output terminal from the flag sense amplifier 8 is connected to an inverter I. A redundancy row decoder 3 is enabled by the output of the inverter I.

A row decoder 4 is connected to the word lines W/Lo, W/L1, ..., W/Ln-1, W/Ln in the main memory cell 1. The redundancy cell block 2 is connected between the bit line of the main memory cell array 1 and a spare word line. The redundancy cell block 2 is enabled by the redundancy row decoder 3. A column decoder 6 is connected to the bit line of the main memory cell array 1. The column decoder 6 is connected to one of the input terminals of the main sense amplifier 7. Another input terminal of the main sense amplifier 7 is connected to the dummy bit line.

For example, the case in which a word line W/L3 selected by the row decoder 4 is failed will be explained as follows.

The transistors Q1 and Q3 are turned on by the clock signal CK and the flag bit decoder signal Yro. A program voltage is applied to the control gate electrode of the flash memory cell F3 through the program terminal PG. As the transistor Q2 is turned on by a flag bit decoder signal Yr1, a voltage of 5 volt is for example supplied to the drain electrode of the flash memory cell F3. Thus the flash memory cell F3 is programmed.

Thereinafter, when a read operation is performed, the transistor Q3 is turned off while the transistors Q1 and Q2 are turned on. The flag terminal (Flag D) is grounded. The flag sense amplifier 8 outputs information stored on the flash memory cell F3 by sensing it. As the redundancy row decoder 3 is enabled in response to the output SWLEW of the inverter I8, the redundancy cell block 2 is selected. Information stored on the cell of the redundancy cell block 2 is output by the main sense amplifier 7 in response to column decoder signals Y0 to Yn.

FIG. 3 is a detailed view of a main sense amplifier shown in FIG. 1, which senses the cell data of the main memory cell block through a data bit line DB in response to the input of the sense amplifier enable signal S1. Then the dummy bit line DBL becomes a low voltage level.

FIG. 4 is a detailed view of a flag sense amplifier shown in FIG. 1, which senses the cell data of the redundancy memory cell block through a dummy bit line DBL in response to the input of the sense amplifier enable signal S2. Then the data bit line DB becomes a low voltage level.

FIG. 5 illustrates a block diagram of a flash memory device with a repair circuit according to a second embodiment of the present invention.

A flag bit cell block 12 is positioned within a guard ring of the main memory cell array 1. The flag bit cell block 12 is consisted of a plurality of flash memory cells. A control gate electrode of each of the flash memory cells is connected to a program terminal PG. A select gate electrode of each of the flash memory cells is connected to each of the gate electrode of each of the transistors in a column decoder 16. A source electrode of each of the flash memory cells is grounded via a flag bit transfer transistor Q1, a node K and transistor Q3. The flag bit transfer transistor Q1 is turned on in response to a flag bit decoder signal Yr. The transistor Q3 is turned on in response to a clock signal CK. The drain terminal of each of the flash memory cells is connected to a flag terminal (Flag-D) through a flag bit transfer transistor Q2 which is turned on in response to the flag bit decoder signal Yr.

The node K is connected to one of the input terminals of the flag sense amplifier 18. Another input terminal of the flag sense amplifier 18 is connected to a dummy bit line (Dummy B/L) to which a reference cell is connected. The output terminal of the flag sense amplifier 18 is connected to an inverter I. A redundancy column decoder 19 is enabled by the output SCOLEN of the inverter.

A row decoder 14 is connected to the word lines W/Lo, W/L1, . . . , W/Ln-1, W/Ln in the main memory cell 1. The redundancy cell block 2 is connected between the word line of the main memory cell array 1 and a spare bit line. The redundancy cell block 2 is enabled by the redundancy column decoder 19. A column decoder 16 is connected to the bit line of the main memory cell array 1. The column decoder 16 is connected to one of the input terminals of the main sense amplifier 17. Another input terminal of the main sense amplifier 17 is connected to the dummy bit line.

For example, the case in which a bit line BL3 selected by the column decoder 16 is a failed will be explained as follows.

The transistors Q3 and Q1 are turned on by the clock signal CK and the flag bit decoder signal Yr. A program voltage is applied to the control gate electrode of the flash memory cell F3 through the program terminal PG. As the transistor Q2 is also turned on by a flag bit decoder signal Yr, a voltage of 5 volt is for example supplied to the drain electrode of the flash memory cell F3. Thus the flash memory cell F3 is programmed.

Thereinafter, when a read operation is performed, the transistor Q3 is turned off while the transistors Q1 and Q2 are turned on. The flag terminal (Flag D) is grounded. The flag sense amplifier 18 outputs information stored on the flash memory cell F3 by sensing it. As the redundancy column decoder 19 is enabled in response to the output SCOLEN of the inverter I, a spare bit line in the redundancy cell block 2 is selected.

As mentioned above, the flash memory device of the present invention has an outstanding effect which can not only improve the repair efficiency but reduce the chip size, by positioning a flag bit cell block capable of programming a repair information within a guard ring of the memory cell array and replacing a fail word line or a bit line with a spare word line or a spare bit line in response to the repair information.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

I claim:

1. A flash memory device comprising:
   a main cell array having a plurality of word lines and a plurality of bit lines;
   a column decoder for selecting any one of said bit lines;
   a row decoder for selecting any one of said word lines;
   a redundancy cell block connected between said bit lines and a plurality of spare word lines;
   a flag bit cell block coupled to said word lines, for storing whether any one word line of said word lines is failed or not;
   a flag sense amplifier coupled to a dummy bit line connected to a reference cell and said flag bit cell block;
   a redundancy row decoder for selecting said spare word lines in response to an output signal of the flag sense amplifier; and
   a main sense amplifier coupled to said dummy bit line and said column decoder.

2. The flash memory device claimed in claim 1 wherein said flag bit cell block is positioned within a guard ring of the main cell array.

3. The flash memory device claimed in claim 1 wherein said flag bit cell block is consisted of flash memory cells.

4. A flash memory device comprising:
   a main cell array having a plurality of word lines and a plurality of bit lines;
   a column decoder for selecting any one of said bit lines;
   a row decoder for selecting any one of said word lines;
   a redundancy cell block connected between said word lines and a plurality of spare bit lines;
   a flag bit cell block coupled to said column decoder, for storing whether any one bit line of said bit lines is failed or not;
   a flag sense amplifier coupled to a dummy bit line which is connected to a reference cell and said flag bit cell block;
   a redundancy column decoder for selecting said spare bit lines in response to an output signal of said flag sense amplifier; and
   a main sense amplifier coupled to said dummy bit line and said column decoder.

5. The flash memory device claimed in claim 4 wherein said flag bit cell block is positioned within a guard ring of the main cell array.

6. The flash memory device claimed in claim 4 wherein said flag bit cell block is consisted of flash memory cells.

* * * * *